United States Patent
Tepper et al.

(10) Patent No.: US 6,291,025 B1
(45) Date of Patent: *Sep. 18, 2001

(54) ELECTROLESS COATINGS FORMED FROM ORGANIC LIQUIDS

(75) Inventors: Frederick Tepper, Sanford; Leonid A. Kaledin; Anatoliy Ugryumov, both of Lake Mary, all of FL (US)

(73) Assignee: Argonide Corporation, Sanford, FL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/326,397

(22) Filed: Jun. 4, 1999

(51) Int. Cl.⁷ .............................. B05D 1/18; B05D 1/02; B05D 1/28; B05D 3/10
(52) U.S. Cl. .................. 427/437; 427/304; 427/427; 427/428; 427/429; 427/438; 427/443.1
(58) Field of Search .................. 427/427, 437, 427/438, 443.1, 304, 305, 306, 428, 429

(56) References Cited

U.S. PATENT DOCUMENTS

| | | | |
|---|---|---|---|
| 3,635,761 | * 1/1972 | Haag et al. | 117/227 |
| 3,653,953 | * 4/1972 | Grant, Jr. et al. | 117/130 E |
| 3,830,650 | 8/1974 | Henriksen . | |
| 4,009,297 | * 2/1977 | Redmond et al. | 427/54 |
| 4,089,686 | * 5/1978 | Townsend | 96/35.1 |
| 4,222,778 | * 9/1980 | Nuzzi et al. | 106/1.11 |
| 4,391,742 | * 7/1983 | Steigerwald et al. | 252/512 |
| 4,424,241 | * 1/1984 | Abys | 427/443.1 |
| 4,434,084 | * 2/1984 | Hicks et al. | 252/512 |
| 4,734,299 | * 3/1988 | Matuzaki et al. | 427/304 |
| 4,908,241 | * 3/1990 | Quast et al. | 427/437 |
| 4,971,944 | 11/1990 | Charles et al. . | |
| 5,009,965 | * 4/1991 | Feldstein | 428/546 |
| 5,158,604 | * 10/1992 | Morgan et al. | 106/1.23 |
| 5,677,014 | * 10/1997 | Ohnishi et al. | 427/555 |

* cited by examiner

*Primary Examiner*—Fred J. Parker
*Assistant Examiner*—Michael Barr
(74) *Attorney, Agent, or Firm*—Cohen & Grigsby, P.C.

(57) ABSTRACT

A process of coating substrates with metal by immersing them into solutions of inorganic compounds in non-aqueous organic liquids. The solution preferably contains two components—a polar organic liquid such as an alcohol, polyol or ketone containing a metal salt in solution. The substrate may be a metal such as steel or aluminum, or a dielectric such as plastic or ceramic, which has been activated by the deposition of colloidal metallic particulates to form a seed metallic layer. The preferred embodiment involves immersion of a metal substrate at room temperature into a simple alcohol such as methanol, containing a salt such as copper chloride. Metal deposits onto the substrate at rates many times greater than aqueous electroless processes. The substrate may be immersed into active solution in a bath, or a paste of the organic and the salt may be formed and painted onto the substrate. In either case, spontaneous deposition occurs on the metal or pre-activated dielectric substrate. Powdered metal may be added to the bath or paint, and the particulates are co-deposited onto the substrate along with freshly formed metal. The salt may be formulated in-situ by digestion of the metal or reduction of a metal compound such as an oxide.

12 Claims, 4 Drawing Sheets

ELECTROLESS COATINGS FORMED FROM ORGANIC LIQUIDS

FIELD OF THE INVENTION

This invention relates to metallic coatings and, in particular, to metallic coatings that are applied to substrate metals, semiconductors and ceramics and plastics.

BACKGROUND

It is well known that metal coatings on substrates have wide applications, including protection from oxidative and corrosive attack, providing wear resistance and as electrical interconnects in electronic circuits and micro-electromechanical (MEMS) devices. There is also a wide diversity of known processes for coating metals on substrates, including electroplating, where many different metals may be deposited and for a large number of applications. In the electroplating process, the substrate typically is immersed in an aqueous bath containing metallic salts, and an electrical current drives the deposition of metals onto the substrate. Electroplating processes require that the substrate be part of the circuit. While the process is useful for the deposition of metals onto metals, it may also be depositing them onto upon non-conducting surfaces such as ceramics and plastics, but only after forming a seed metallic layer by alternative processes.

During electroplating the flow of electrons from the part to be plated through the solution to an anode determines where the metal ions deposit on the surface of the part. Because like charges repel one another, the electrons that try to flow from recess (the bottom of corners in a part) are retarded and electrons on the outside edges (points and the like) "see" fewer opposing electrons in close proximity, thus flow in greater numbers. The phenomenon produces thicker deposits at "high current density" points and thinner deposits at "low current density" sites. The work-piece to be coated is ordinarily limited to a size that fits within the dimensions of a bath.

Brush electroplating is a variant of electroplating which uses a tampon that is wet with electrolytic fluid and which is in electrical contact with the workpiece to locally deposit metal electrochemically. Electrochemical metallization is similar in that large surfaces are coated by moving a receptacle containing electrolytic fluid over a work-piece. In this case, the receptacle is part of an electrical circuit with the work-piece. Both brush electroplating and electrochemical metallization use substantially less quantities of fluid and generate less plating wastes than electroplating.

Electroless plating is a process in which metal ions in a dilute aqueous solution are deposited onto a substrate by means of a continuous chemical reaction. The process may also be defined as deposition by autocatalytic chemical reduction where the metal ions are reduced to metal by a chemical reagent. The reaction is dependent on catalysis by the surface of the workpiece, so that a coating forms upon it, while deposition elsewhere is minimized. For deposition to continue when the substrate is completely covered, the coating metal as well as the basis metal must be capable of catalyzing the surface, thus the term "autocatalytic". Electroless plating is most often done with nickel and copper, with some limited use with cobalt and precious metals. The plating is typically carried out in a bath so that the composition of the salts and temperature can be closely regulated. Electroless coatings are used in a wide diversity of industries including the chemical industry, electronics, automotive, aerospace and mining.

Electroless deposition takes place wherever the catalytic surface is wetted, which normally results in a more uniform deposit of metal compared to electrolytic plating. However, electroless processes are slower than electroplating. For thicker coatings, electroless deposition is often used as a pre-coating step followed by electrolytic deposition.

Electroless deposition processes are the subject of numerous patents. Not withstanding the number of such processes, they all appear to involve aqueous baths consisting of the metal salt, a reducing agent, a pH modifier, and complexing agents to optimize the deposition process. Several hundred different plating compositions have been reported for nickel alone and hundreds of others have been evaluated or used with copper or other metals. Because the electroless plating process "plates" by the chemical reaction of many components in the bath, control of the rate of plating is very difficult; therefore, time, temperature, the concentration of reducing agents, and the reaction products all affect the plating rate. For example, copper may be deposited at a rate of 0.03 to 0.06 microns/min at room temperature but an increase in temperature to 60° C. is necessary to achieve rates of 0.15 microns/min (See Glenn O. Mallory and Juan B. Hajdu, Electroless Plating, Fundamentals and Applications, American Electroplaters Soc. 1990). However, if the rate is too fast, the bath may spontaneously decompose resulting in metal being plated all over the tank. If it is too slow, plating might cease or not initiate at all. For these reasons it is very difficult to predict or control electroless plating thickness. If the chemistry of the bath is not properly controlled, the physical characteristics of plated deposits may vary more than with electroplating baths. Complexing agents such as EDTA (ethylene diamine tetracetic acid) are often used to prevent premature deposition of metal particulates in the bath. For example, U.S. Pat. No. 5,248,527 provides a process for electroless plating tin, lead or tin-lead alloy on copper or copper alloy using an electroless plating bath containing a water soluble tin and/or lead salt, an acid capable of dissolving the salts, and a complexing agent. Also, numerous pre-processing techniques are available to prepare the surface of the work piece to accept the metal.

Electroless deposition creates decomposition products that contaminate the bath, requiring bath replacement and chemical waste disposal. Bath decomposition occurs even when plating is not taking place, and thus there is a need to recycle baths. For instance, in electroless nickel deposition, typical reducing agents are hypophosphites or borohydrides, which form phosphides or borides to drive the reaction. In hypophosphite reduction of nickel salts, the build-up of orthophosphite ions results in slow deposition and poor quality of deposit. Therefore, the life of any electroless nickel bath is limited to a few turnovers, for example, approx. 10–12. Consequently, these baths are treated as a waste product at regular intervals and there is considerable environmentally objectionable waste that is produced. Many of these baths also create hazardous vapors, particularly when the baths are heated to increase plating rate. Further, the electroless nickel coatings, which have phosphide or boride inclusions are hard and useful for wear applications, but they have low ductility and are brittle. To form ductile nickel coatings, electrolytic rather than electroless plating is used.

Electroless processes have also been used in depositing metal onto plastic. In this case, the surface of the plastic is modified to achieve adhesion by (a) mechanical methods resulting in a rougher surface providing better anchoring sites for the coating, (b) surface modification by chemical methods improving bond formation, (c) by bombardment with high energy particulates, or combinations of the above methods. Etching involves chemical removal of one of the components of a resin while maintaining the physical integrity of the bulk resin. When this is achieved, a mechanical bond results. Chemical bonds, or bonds without etch porosity, contribute to adhesion but by themselves are insufficient and often fail in wet environments particularly when the part is thermally stressed. After etching, a catalyst, tin-palladium is absorbed into the etched surface so as to initiate electroless metal deposition.

Many processes are known for depositing precious metal catalysts onto non-conductor substrates to facilitate adhesion of the subsequent metallic deposit. For example, U.S. Pat. Nos. 4,136,216, 4,151,311 and 4,233,344 which describe processes that use colloids of non precious metals, formed in solution and precipitated onto non-conducting surfaces in lieu of precious metals. The colloidal copper that is present only to a very small extent serves as an activator and not the source of the metal deposit. U.S. Pat. No. 5,492,613 discloses a process for electroless plating a metal on the surfaces of nonconductive material substrates by brushing or spraying composite chemical solutions to activate the surface. The surface is subjected to mechanical or chemical agent solution pretreatment to activate the surface to form catalyst sites. Copper is then deposited by brush electroplating or by immersing in electrolytic or electroless baths.

U.S. Pat. No. 5,759,230 discloses a method of forming nanostructured metallic films of tungsten, titanium, molybenum, rhenium and tantalum by reaction of a metal salt which is soluble in an alcohol, and heating the substrate, generally to about 120–200° C. with the solution to deposit films with nanosize grains. U.S. Pat. No. 4,539,041 describes a process for reducing in a liquid phase a solid compound selected from the oxide, hydroxide or salt of a metal selected from the group consisting of gold, palladium, iridium, osmium, copper, silver, nickel, cobalt, lead and cadmium, which comprises heating said solid compound suspended in a polyol and thereafter isolating the formed metallic precipitate.

U.S. Pat. No. 5,529,804 describes a process for the production of hard materials wherein hard constituent powders are coated with cobalt and/or nickel metal in solution by heating the metal containing powders in a polyol and boiling for many hours, reducing the metals. The source of the metal is an oxide, hydroxide or salt. The polyol functions both as a solvent and a reducing agent at the same time and is present in an amount of at least 5 times more moles of polyol than moles metal. It is stated that an even distribution of the cobalt and/or nickel is achieved over the surface of the hand constituent powder without the formation of islands of pure metal.

U.S. Pat. No. 4,098,922 describes a method of depositing a metal on a substrate which comprises coating the substrate with a sensitizing solution comprising a reducible salt of non-noble metal, a primary reducing agent selected from the group consisting of 2,7 anthraquinone disulfonic acid, alkali metal salts of 2,7 anthraquinone disulfonic acid and mixtures thereof, and a secondary reducing agent which can be a polyol. The substrate is then dried and stored for at least 3 days and exposed to ultraviolet light to form a catalytic layer.

Methods of producing structures of nanophase materials are being sought because they have an array of novel attributes. For example, nanophase copper is five times stronger than the ordinary metal [2]. Unfortunately it is difficult to prepare fully dense (non-porous) nanostructures by powder metallurgical means because consolidation by heat and/or force causes recrystallization and grain growth. Methods of forming nanocrystalline grain structures at room temperature are desired to circumvent the grain growth that occurs during densification.

The object of the present invention is to provide a new electroless method of deposition that overcomes the limitation of the numerous prior art methods. It is a further object of the invention to provide electroless deposition of metals onto substrates which heretofore have not been amenable to electroless process. A yet further object of the invention is to provide a fast, economical method for placing a metallic coating on a substrate.

SUMMARY OF THE INVENTION

Generally, the present invention provides a method for using non-aqueous organic liquids such as methanol, ethylene glycol and acetone as convenient liquid media for chemical metallization of substrates. Further, many of these liquids are also capable of reducing metallic salts to form the metallic deposits. The deposition can be very rapid, exceeding that of aqueous electroless deposition. For many salts that are not readily reduced, the organic liquid of the present invention can act as a solvent for additional reducing agents such as stannous chloride and/or formaldehyde. Also, ultrafine metal powders may be used as the source of metal ions. The coating mixture, whether in the form of a liquid, or slurried with metal powders, is adaptable to being painted or sprayed onto large area surfaces. The slurried mixture may also be applied as a paste over the surface of the substrate.

The method of the present invention provides for metallization of metallic surfaces immersed in an organic solution. Dielectric substrates may also be coated by the method, if they are first seeded by pre-deposition or co-deposition of a colloidal metal layer. Additionally, the invention utilizes an organic liquid such as methanol, ethanol, ethylene glycol, acetone, or trichloroethane, into which are dissolved or contain a soluble metal salt such as copper, nickel, cobalt, tin, gold or silver chloride as the source of the metal to be deposited. This method can also utilize reducing agents such as stannous chloride or formaldehyde which may be added to the mix to provide greater reducing power.

In another embodiment of the invention, fine metallic powders are substituted for the soluble metal salt. In this case, an acid such as hydrochloric acid is used to induce digestion of the metal into the organic liquid. The powder is a source of ions for producing new metal, which is thereafter deposited and the residual particulate metal may be co-deposited with the new metal to form a composite. Non-porous, fully dense coatings containing nanosize grains are produced at room temperature.

The active organic/metal containing mixture such as described above may be applied to substrates as a paint or spray, rather than immersing the substrate in a bath. This permits the coating of large area surfaces and reducing waste by reducing the volume of plating solutions used in baths as well as eliminating dependence to recycle baths as in electroless deposition. If the source of the metal ions is metal powders, then the residual particulate metal may be co-deposited with the new metal. Also, inert particulates such as tungsten carbide, diamond or polymer may be added to the bath or the paint (or slurry) to produce composite coatings.

Moreover, when these mixtures are used as a bath process, or as a paint, rapid deposition can be achieved even at ambient temperature. Another advantage of the present invention is that there is no particulate formation in organic/salt baths, eliminating the need for complexing and other agents ordinarily used to stabilize electroless baths. Additionallly, nickel and cobalt coatings can be produced without using phosphorous or boron-containing reducing agents such as hypophosphite, or boranes, resulting in ductile nickel or cobalt coating. Other advantages of the present invention will become apparent from a perusal of the following detailed description of the presently preferred embodiments of the invention taken in connection with the accompanying tables, and drawings.

PRESENTLY PREFERRED EMBODIMENTS

The metallic coating resulting from the electroless deposition of the present invention can be used to change the functional properties of the substrate to improve its corrosion or oxidation resistance, improve its wear on steel, aluminum and aluminum alloys surfaces, or to cause conductors to form on dielectric substrates. In the method of the present invention, the substrate metals are immersed into solutions of organic liquids complexed with soluble metal salts at room temperature and this results in metallic deposits on the substrates. A preferred mixture for copper deposition is a copper salt such as cupric chloride in an alcohol, such as methanol. However, other organic liquids such as a polyol (e.g.—ethylene glycol), a ketone such as acetone and a halocarbon such as trichloroethane have also been shown to form complexes that will produce metal coatings on substrates.

The metal containing compound can be a metal salt such as copper chloride, a metal sulfate, metal formate or any other salt which has some solubility or can form an adduct with the organic medium so as to be solubilized. Such a two component mixture is suitable for the deposition of copper, nickel, cobalt, tin, gold and silver. However, it is not necessary that a metal salt be used. An ultra-fine metal powder can be used as the source of the metal, where a solvating agent including an acid such as hydrochloric is also added to the mixture to digest the powder.

It has been found that certain metals such as zinc do not always spontaneously deposit onto metal substrates from such organic solvent/metal salt solutions without the addition of a reducing agent such as stannous chloride. Thus, zinc deposits may be obtained by using a mixture of stannous chloride dissolved in methanol and appropriate ultrafine metal. Also, more powerful reducing agents such as lithium aluminum chloride could be used in the deposition of refractory metals such as tantalum and titanium. Ductile nickel deposits can be formed by the invention since reducing agents such as hypophosphite, sodium borohydride or boranes, which form brittle phases in the deposit are absent.

The rate of deposition can be very rapid and continuous, often exceeding one micron thickness per minute. Metal substrates include steel, aluminum, titanium, tantalum, copper, nickel and silicon. After appropriate surface treatment, the coatings can be applied to ceramics such as aluminum oxide, or to polymeric substrates.

The organic/salt solution can be thickened and applied as a paint over the surface of the substrate. In another embodiment, slurries of the metal are formed with the organic solvent and an acid to solubilize the metal. It is not necessary that all the metal in the powder dissolve, since there can be sufficient metal reacted from the surface and redeposited to act as a cement for any residual powder to form a film with a composite grain structure. In this case, a thickened slurry is applied to the surface, and after some minutes or tens of minutes, the slurry hardens to form a layer. The slurry may also be applied as a paste. Also, a foreign particulate such as another metal may be co-deposited along with the first metal. For example, a copper adduct (copper chloride in ethanol) is prepared and nickel powder is added to it. The slurry is applied to the surface and allowed to harden. After hardening and washing with water, a complex coating of nickel and copper is attached to the substrate. The particulate phase may also be an inert material such as tungsten carbide, diamond or polymer that would provide certain characteristics to the surface such as wear resistance.

Paint and deposition slurry provides the advantage that coatings can be applied over large area surfaces and for parts too large to be plated in a bath. Also, the paint or slurry can be applied locally over damaged surfaces similar to brush electroplating. When using a paint or slurry, large volume baths are avoided, which reduces the volume of environmentally objectionable plating wastes.

Because the deposition rate of the present process is high, parts may be deposited on a mandrel, creating a part that is then separated from the mandrel.

The invention can be further understood from the following illustrative examples of presently preferred embodiments.

Example 1

A series of mixtures of cupric chloride ($CuCl_2$) in methanol as shown in Table 1 were formulated. Steel samples approximately 3 cm×3 cm×0.2 cm thick were prepared by polishing them with abrasive paper and then optionally treated the surface of the steel by immersion in hydrochloric acid (concentration 15–20%) for approximately 5 minutes. The samples were rinsed with alcohol and immersed into a cupric chloride/methanol solution that was agitated by hand. Immediately, a reddish film formed on the surface of the steel. After approximately 1 minute, the sample was removed and the thickness of the coating was measured by the use of a magnetic susceptibility gauge (Model CGX, manufactured by Coating Measurement Instruments (CMI)). A series of 10 to 20 measurements were taken on different locations on the surface that were then averaged. The accuracy of the method is estimated to be 20–30 percent.

The concentration of the cupric chloride was varied in examples 1a through 1h and the resulting deposition rates were computed, and are seen in Table 2, as compared to literature values for the deposition rate of electroless copper (Glenn O. Mallory and Juan B. Hajdu—Electroless Plating—Fundamentals and Applications, American Electroplaters Soc. 1990) done in aqueous baths. The deposition rate in the invention of non-aqueous mixture is approximately an order of magnitude greater than that of aqueous mixtures. As can be seen from Table 2, the deposition rate is roughly proportional to the concentration of the salt in the methanol.

Several of the samples were bent around a radius of approximately 2 mm and it was noted that the films were adherent to the substrate.

TABLE 1

Deposition Rate of Copper Films

| # | Components | Concentration g/L | Deposition time minutes | Thickness microns | Deposition rate microns/hr | Substrate |
|---|---|---|---|---|---|---|
| 1a | $CuCl_2$ | 20 | 1 | 0.8 | 48 | Steel |
| | Methanol | to 1 L | | | | |
| 1b | $CuCl_2$ | 40 | 1 | 1.5 | 90 | Steel |
| | Methanol | to 1 L | | | | |
| 1c | $CuCl_2$ | 60 | 1 | 2.0 | 120 | Steel |
| | Methanol | to 1 L | | | | |
| 1d | $CuCl_2$ | 80 | 1 | 2.3 | 140 | Steel |
| | Methanol | to 1 L | | | | |
| 1e | $CuCl_2$ | 100 | 1 | 3.0 | 180 | Steel |
| | Methanol | to 1 L | | | | |
| 1f | | | 2 | 4.6 | 180 | Steel |
| 1g | | | 3 | 5.4 | 180 | Steel |
| 1h | $CuCl_2$ | 120 | 1 | 3.0 | 180 | Steel |
| | Methanol | to 1 L | | | | |
| 2 | $CuCl_2$ | 100 | 5 | 2 | 24 | Aluminum |
| | Methanol | to 1 L | | | | |
| 3 | $CuCl_2$ | 100 | 5 | 4.3 | $52^{1,2}$ | Titanium |
| | Methanol | to 1 L | | | | |
| 4a | $SnCl_2$ | 120 | 1 | 1.4 | $84^3$ | Steel |
| | $CuCl_2$ | 60 | | | | |
| | $Cu^4$ | 60 | | | | |
| | Methanol | to 1 L | | | | |
| 4b | | | 3 | 2.8 | 84 | Steel |
| 4c | | | 5 | 4.7 | 84 | Steel |
| 5a | $SnCl_2$ | 60 | 8 | 4 | $30^1$ | Steel[5] |
| | $Cu^4$ | 100 | | | | |
| | HCl | 6 ml | | | | |
| | Methanol | to 1 L | | | | |
| 5b | | | 8 | 1 | $7.5^1$ | Steel[6] |
| 6 | $SnCl_2$ | 60 | 5 | 1.1 | $13^{1,3}$ | Steel |
| | $Cu^4$ | 30 | | | | |
| | HCl | 3 ml | | | | |
| | Ethanol | to 1 L | | | | |
| 7 | $SnCl_2$ | 60 | 5 | 1.4 | $17^{1,3}$ | Steel |
| | $Cu^7$ | 30 | | | | |
| | HCl | 3 ml | | | | |
| | Ethanol | to 1 L | | | | |
| 8 | $SnCl_2$ | 60 | 5 | 1.4 | $17^{1,3}$ | Steel |
| | $Cu^8$ | 30 | | | | |
| | HCl | 3 ml | | | | |
| | Ethanol | to 1 L | | | | |
| 9 | $SnCl_2$ | 60 | 3 | 1.4 | $28^{1,3}$ | Steel[9] |
| | $CuCl_2$ | 60 | | | | |
| | $Cu^4$ | 30 | | | | |
| | Glycerol | 250 ml | | | | |
| | Methanol | to 1 L | | | | |
| 10 | $SnCl_2$ | 60 | 5 | 1 | $12^{1,10}$ | Steel |
| | $Cu^4$ | 30 | | | | |
| | Ethylene Glycol | to 1 L | | | | |
| 11 | $SnCl_2$ | 60 | 5 | 1.6 | $19^{1,10}$ | Steel |
| | $Cu^4$ | 30 | | | | |
| | HCl | 6 ml | | | | |
| | Acetone | to 1 L | | | | |
| 12 | $SnCl_2$ | 60 | 3 | 0.4 | $8^{1,10,11}$ | Steel |
| | $Cu^4$ | 100 | | | | |
| | Formaldehyde | 100 ml | | | | |
| | HCl | 6 ml | | | | |
| | 1,1,1-Trichloroethane | to 1 L | | | | |

TABLE 1-continued

Deposition Rate of Copper Films

| # | Components | Concentration g/L | Deposition time minutes | Thickness microns | Deposition rate microns/hr | Substrate |
|---|---|---|---|---|---|---|
| 13 | $Cu^4$<br>HCl<br>Ethanol<br>$NH_4OH^{13}$ | 20<br>30 ml<br>to 1 L<br>pH from 10 to 10.5 | 30 | 1 | 2 | Alumina[12] |

Notes:
[1]It was assumed that the deposition rate is a constant during the deposition;
[2]Determined by weighing before and after on balance with accuracy ±0.0001 g. The coating was completely separated from the substrate and then weighed. The accuracy of the method is estimated to be 20 percent;
[3]Determined by weighing before and after deposition. A correction on the weight loss due to etching of the substrate was applied. The accuracy of the method is estimated to be 40 percent;
[4]Nanopowder with average particle size of 100 nm was used that are agglomerated into the particles of an average size of 1–2 microns;
[5]After 10–24 hours of aging the bath composition is separated onto two parts. The top portion resembles a gel and the bottom portion resembles the paste. In this case the top portion of the bath solution was applied to the substrate;
[6]In this case the bottom portion of the bath solution (see footnote 5) was applied to the substrate;
[7]Average particle size is 1–1.5 microns. Powder is obtained from Alfa Aesar;
[8]Average particle size is 3 microns. Powder is obtained from Alfa Aesar;
[9]Paste was applied to the substrate;
[10]Determined by weighing procedure. No correction on the etching of the substrate was applied. The accuracy of the method is estimated to be 50 percent;
[11]A non-compact copper powder grew very rapidly on the surface to a thickness of 0.3–0.6 mm. After removal of excess metal powder by rinsing with water, a compact copper coating was found on the substrate;
[12]Substrate was etched using a solution with a concentration of 25 grams of $CrO_3$ in 80-weight % $H_2SO_4$ at 70° C. during 5 minutes and then rinsed out in water. Substrate was then sensitized using a solution of 45 grams of $SnCl_2$ and 45 ml of HCl (36–38%) in 1 liter of distilled water at room temperature during 2 minutes and then rinsed out using a solution with a concentration of 10 grams of sodium hypophosphite in 1 liter of water. Substrate was then activated using a solution of 0.35 grams of $PdCl_2$ and 2 ml of HCl (36–38%) in 1 liter of distilled water at room temperature during 3 minutes and then rinsed out with tap water;
[13]Ammonium hydroxide was added to adjust pH from 10 to 10.5.

TABLE 2

Deposition Rates of Copper

| Deposition Time, min | Electroless copper bath at 82° F. | Slow speed commercial bath at 82° F. | High speed commercial bath at 82° F. |
|---|---|---|---|
| 1 | 180 | 2.25 | 7 |
| 2 | 96 | 2.25 | 7 |
| 3 | 48 | 2.25 | 7 |

Example 2

Figure 1:
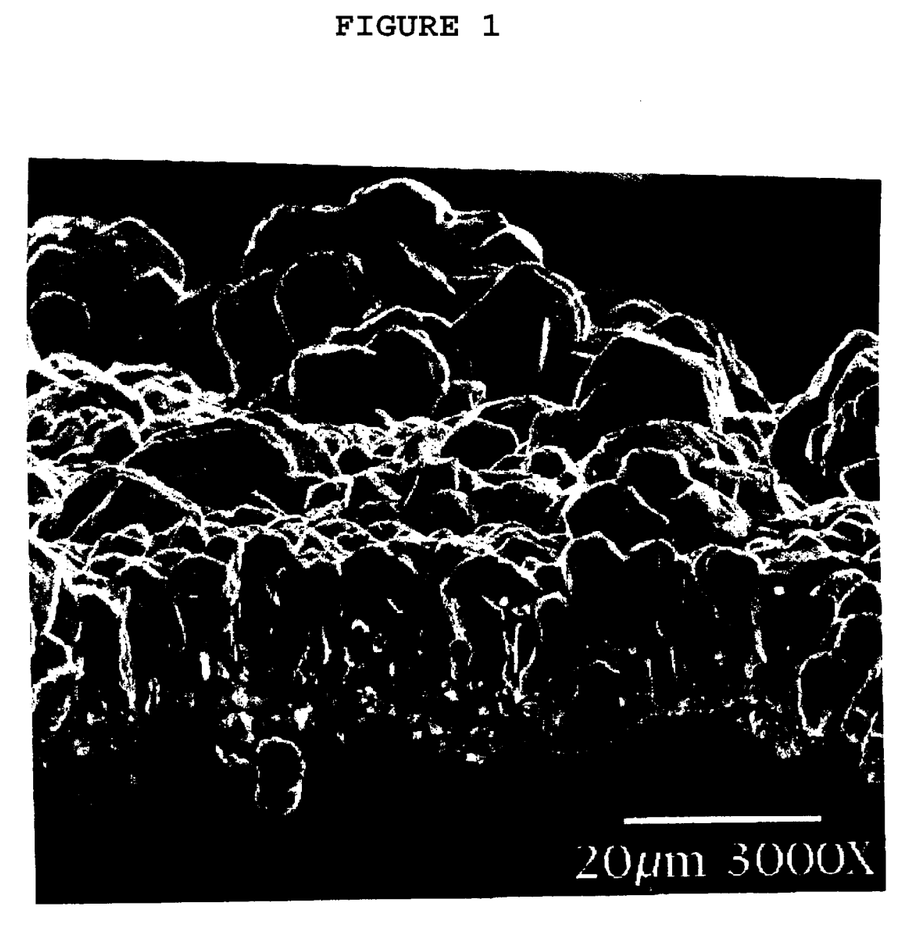
FIG. 1 is an SEM at a film of copper deposited onto steel and then peeled from the surface.

A copper film was deposited as in Example 1e using a concentration of 100 grams of $CuCl_2$ in 1 liter of methanol during 5 minutes. Generally, it has been found that the higher the deposition rate, the poorer the adhesion. The purpose of this experiment was to form a weak bond so that the copper could be removed from the steel for subsequent characterization. FIG. 1 shows a scanning electron micrograph cross section of the film, with the bottom side that had been first deposited and the top surface being the last to be deposited. Note the smaller grains first deposited, and the dendritic growth that occurs subsequent to the first deposit, producing an irregular surface. The total thickness of the film was approximately 10 microns.

Example 3

A copper film was deposited on aluminum (Table 1, sample 2) after treating the aluminum sheet (approximately 1 mm thick) by polishing with abrasive paper and then immediately immersion of the sample into the bath. The deposition was done as in Example 1, using a concentration of 100 grams of $CuCl_2$ in 1 liter of methanol. The thickness as summarized in Table 1 was determined by weighing before and after deposition. A correction on the weight loss due to etching of the substrate was applied. The accuracy of the method is estimated to be 40 percent. It was assumed that the deposition rate was a constant during the 5 minutes of deposition of the experiment.

Example 4

A copper film was deposited on titanium (Table 1, sample 3) as described in Example 3, except that the titanium was treated by polishing with abrasive paper. The thickness of the copper layer (4.3 microns) was determined by weighing before and after deposition. A correction on the weight loss due to etching of the substrate was applied. The accuracy of the method is estimated to be 40 percent.

Example 5

Example 1 was repeated except that copper powder was added to the methanol rather than cupric chloride (Table 1, sample 4). The copper was produced by the electroexplosion method [3] that typically prepared spherical particles with an average particle size of 100 nanometers. No copper coating was observed with copper in methanol alone. However, in three separate experiments (Table 1, bath formulations 4–6), copper deposition occurred when stannous chloride was added to the mixture at concentrations defined in Table 1.

The deposition rate determined by the weight gain method as in Example 3. The deposition rate was assumed to be a constant over five minutes.

Example 6

A similar experiment was done as described in Example 5, except that hydrochloric acid was added to help dissolve the copper powder (Table 1, sample 5). The mixture was allowed to sit for one day and was found to separate into two fractions. The top portion resembled a gel and the bottom portion resembled a paste. The two fractions were separated. In the upper case as shown in Table 1, the steel was in the more fluid upper fraction, while the lower sample was immersed into the thicker fraction. The deposition rate was observed to be higher when the steel sample was immersed in the paste fraction.

Example 7

Example 6 was repeated, except that ethanol was used rather than methanol as the solvent (Table 1, sample 6). It was noted that the deposition rate in ethanol was less than with methanol. It was assumed that the copper powder was digested to form some copper in solution, and that the solubility of the resulting salt is not as great in ethanol than in methanol.

Example 8

Example 7 was repeated, except that the copper powder (obtained from Alfa Aesar) we used was 1–1.5 microns in size (Table 1, sample 7). It was noted that even with this coarser copper, the deposition rate was at least as rapid as that mixture produced from the nanopowders.

Example 9

Example 7 was repeated again except that another copper powder from Alfa Aesar which has an average particle size of 3 microns (Table 1, sample 8). The deposition rate was about equivalent to the rate obtained with the 1–1.5 micron powder. It appeared that the digestion rate with powders as large as 3 microns is sufficient to produce rapid deposition rates.

Example 10

A slurry of tin and copper chlorides and 100 nanometer size copper powder in methanol was prepared, to which was added 100 ml of glycerol to thicken the slurry (Table 1, sample 9). The thickened slurry was painted on the pretreated steel surface. A moderate to high rate of copper was deposited on the steel without having to immerse the metal in a bath.

Example 11

A mixture of 100 nanometer size copper plus 60 grams of stannous chloride in 1 liter of ethylene glycol was prepared (Table 1, sample 10), and the pretreated steel was immersed into such a bath for 5 minutes. A coating formed which was measured using the CMI gauge as in Example 1, by taking a series of 10 to 20 measurements on different spots on the surface of the steel to obtain an average coating thickness. A deposition rate of 12 microns of copper per hour was determined.

Example 12

Example 5 was repeated, except that acetone was used as a solvent (Table 1, sample 11). A copper thickness of 1.6 microns over 5 minutes of deposition was obtained.

Example 13

A mixture was prepared of copper powder, HCl, tin chloride and formaldehyde, except in this case trichloro ethylene, a halogenated organic, was used as the solvent (Table 1, sample 12). A non-adherent copper powder grew very rapidly on the surface reaching the thickness of 0.3–0.6 mm. After removing this metal powder by rinsing with water, a compact copper coating was found on the substrate.

Example 14

Figure 2:
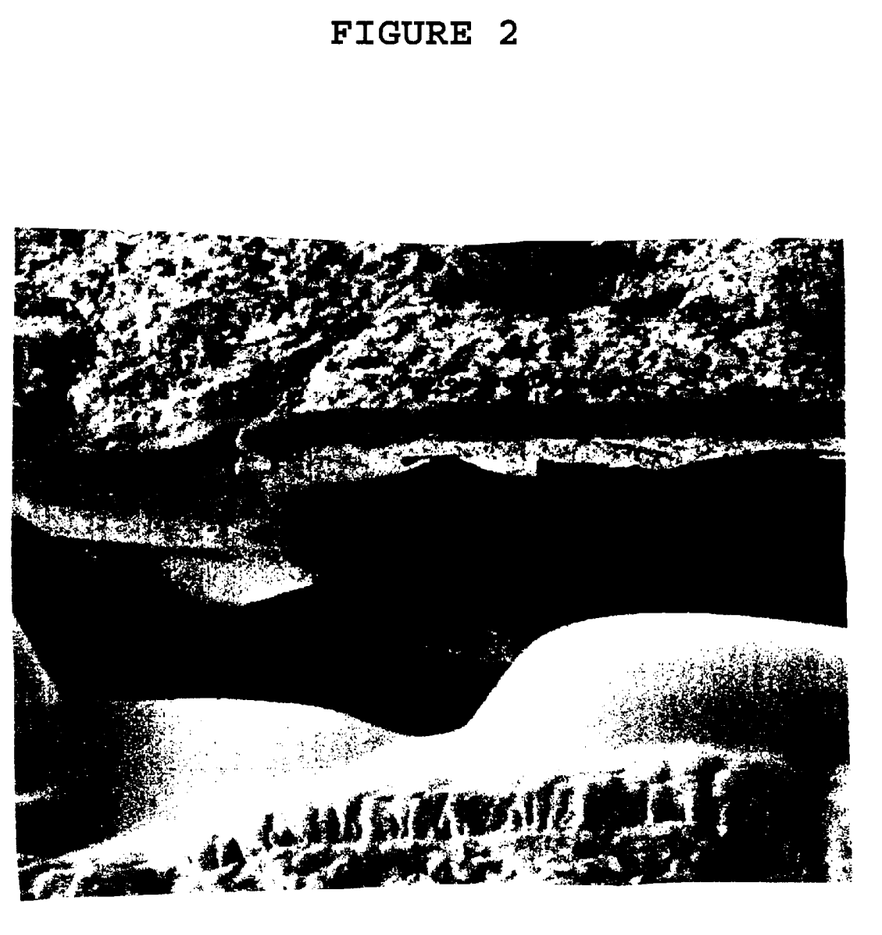
FIG. 2 is a Focus Ion Beam (FIB) image of copper coating on aluminum oxide.

A mixture was prepared of copper powder, HCl in 1 liter of ethanol. Ammonium hydroxide was added to adjust pH of the bath from 10 to 10.5 (Table 1, sample 13). Substrate of aluminum oxide was etched using a solution with a concentration of 25 grams of $CrO_3$ in 80-weight % $H_2SO_4$ at 70° C. during 5 minutes and then rinsed out in water. Substrate was then sensitized using a solution of 45 grams of $SnCl_2$ and 45 ml of HCl (36–38%) in 1 liter of distilled water at room temperature during 2 minutes and then rinsed out using a solution with a concentration of 10 grams of sodium hypophosphite in 1 liter of water. Substrate was then activated using a solution of 0.35 grams of $PdCl_2$ and 2 ml of HCl (36–38%) in 1 liter of distilled water at room temperature during 3 minutes and then rinsed out with tap water. A copper coating was produced having thickness of about 1 micron. FIG. 2 shows a Focused Ion Beam (FIB) scan of the film.

Example 15

Figure 3:
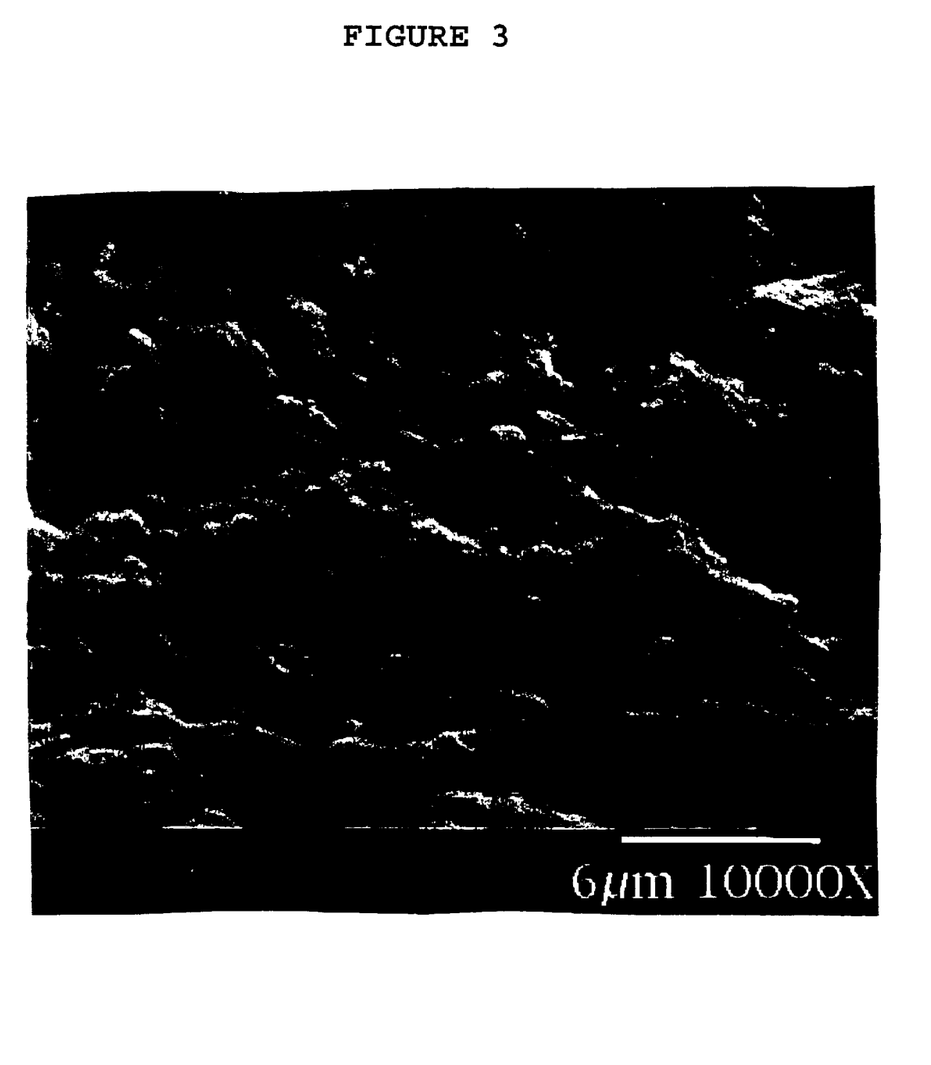
FIG. 3 is an SEM of Nickel on steel.

A solution was prepared of 60 grams of stannous chloride per liter of methanol (Table 3, sample 1), to which was added electroexploded nickel powder with an average particle size of 100 nanometers. The thickness of nickel coating on the steel substrate was estimated by weight gain as approximately 2.9 microns. This sample was black. The coating was adherent on the steel surface even after bending. The sample was examined by scanning electron microscopy and is seen in FIG. 3. The coating appears continuous. There is a significant amount of surface irregularity as in the case of the copper deposit. We believe that this surface irregularity was responsible for the sample not being shiny.

TABLE 3

Deposition Rate of Nickel Films

| # | Components | Concentration g/L | Deposition time minutes | Thickness microns | Deposition rate micron/hr | Substrate |
|---|---|---|---|---|---|---|
| 1a | $SnCl_2$ | 60 | 20 | 2.9 | 8.7 | Steel |
| | Ni[1] | 60 | | | | |
| | Methanol | to 1 L | | | | |

TABLE 3-continued

Deposition Rate of Nickel Films

| # | Components | Concentration g/L | Deposition time minutes | Thickness microns | Deposition rate micron/hr | Substrate |
|---|---|---|---|---|---|---|
| 1b | | | 3 | 0.5 | 10 | Aluminum[2] |
| 2a | Ni[1] HCl Ethanol NH$_4$OH[4] | 20 30 ml to 1 L pH from 10 to 10.5 | 60 | 1 | 1 | ABS plastic[3] |
| 2b | | | 60 | 1 | 1 | Epoxy plastic[3] |

Notes:
[1]Nanopowder with average particle size of 100 nm was used that are agglomerated into the particles of an average size of 1–2 microns;
[2]Substrate had been polished with abrasive paper and then was immediately immersed into the bath;
[3]Substrate was etched using a solution with a concentration of 25 grams of $CrO_3$ in 80-weight % $H_2SO_4$ at 70° C. during 5 minutes and then rinsed out in water. Substrate was then sensitized using a solution of 45 grams of $SnCl_2$ and 45 ml of HCl (36–38%) in 1 liter of distilled water at room temperature during 2 minutes and then rinsed out using a solution with a concentration of 10 grams of sodium hypophosphite in 1 liter of water. Substrate was then activated using a solution of 0.35 grams of $PdCl_2$ and 2 ml of HCl (36–38%) in 1 liter of distilled water at room temperature during 3 minutes and then rinsed out with tap water;
[4]Ammonium hydroxide was added to adjust pH from 10 to 10.5.

Example 16

Example 15 was repeated with the exception that an aluminum substrate that had been polished with abrasive paper and then was immediately immersed into the bath. It was allowed a residence time of 3 minutes before the substrate was washed off. The thickness of the film was estimated to be approximately 0.5 microns.

Example 17

A mixture was prepared of nickel powder, HCl in 1 liter of ethanol. Ammonium hydroxide was added to adjust pH of the bath from 10 to 10.5 (Table 3, sample 2). An ABS plastic and an epoxy plastic that is using for manufacturing of electronic boards were etched using a solution with a concentration of 25 grams of $CrO_3$ in 80-weight % $H_2SO_4$ at 70° C. during 5 minutes and then rinsed out in water. Plastics were then sensitized using a solution of 45 grams of $SnCl_2$ and 45 ml of HCl (36–38%) in 1 liter of distilled water at room temperature during 2 minutes and then rinsed out using a solution with a concentration of 10 grams of sodium hypophosphite in 1 liter of water. Plastics were then activated using a solution of 0.35 grams of $PdCl_2$ and 2 ml of HCl (36–38%) in 1 liter of distilled water at room temperature during 3 minutes and then rinsed out with tap water. A nickel coating was produced having thickness of about 1 micron.

Example 18

Figure 4:
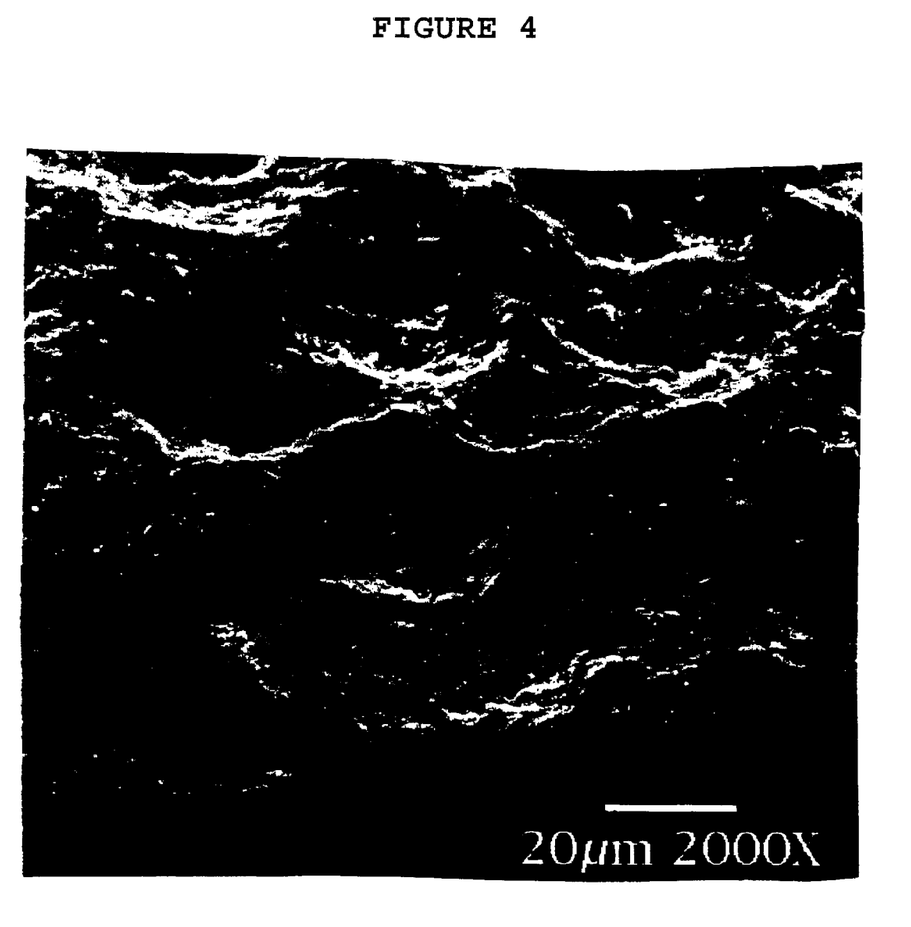
FIG. 4 is an SEM of Cobalt on steel.

Example 15 was repeated except cobalt powder of 1.6 microns size was used. The thickness of cobalt coating on the steel substrate was estimated by weight gain as approximately 7 microns. This sample was black. The coating was adherent on the steel surface even after bending. FIG. 4 shows a scanning electron micrograph of this sample. The appearance was very similar to that of the nickel SEM in FIG. 3.

TABLE 4

Deposition Rate of Cobalt Films

| # | Components | Concentration g/L | Deposition time minutes | Thickness microns | Deposition rate micron/hr | Substrate |
|---|---|---|---|---|---|---|
| 1 | $SnCl_2$ Co[1] Methanol | 60 60 to 1 L | 960 | 7 | 0.4 | Steel |
| | | | 3 | 0.5 | 10 | Aluminum[2] |

Notes:
[1]The average particle size is 1.6 microns, as specified by Alfa Aesar;
[2]Substrate had been polished with abrasive paper and then was immediately immersed into the bath.

Example 19

Example 16 was repeated on an aluminum substrate except with cobalt powder rather than nickel powder. The immersion time was 3 minutes, and we estimated the thickness to be 0.5 micron. The quality of this Co coating was much better than that of Ni, i.e., there were no visible cobalt particles on the surface.

Example 20

A slurry was prepared containing 30 grams of tin with a particle size of 100 nanometers, plus 30 g of stannous chloride in 1 liter of methanol. Sample of steel was polished with abrasive paper and were put into the bath. The thickness of the layer was measured using the CMI gauge as in Example 1, by taking a series of 10 to 20 measurements on different spots on the surface of the steel to obtain an average coating thickness. The thickness was found to be about 2.4 microns.

TABLE 5

Deposition Rate of Tin Films

| # | Components | Concentration g/L | Deposition time minutes | Thickness microns | Deposition rate micron/hr | Substrate |
|---|---|---|---|---|---|---|
| 1 | SnCl$_2$ | 30 | 3 | 2.4 | 48 | Steel |
|   | Sn[1] | 30 | | | | |
|   | Formaldehyde | 150 ml | | | | |
|   | Methanol | to 1 L | | | | |

Note:
[1] Nanopowder with average particle size of 100 nm was used that are agglomerated into the particles of an average size of 1–2 microns.

Example 21

A slurry was prepared containing 100 grams of zinc with a particle size of 100 nanometers, plus 60 g of stannous chloride in one liter of methanol. The bath was aged for 20 hours until the methanol dried until reduced to a paste. Samples of steel, aluminum and titanium were polished with abrasive paper and were put into the bath filled with the paste and left there for 15 hours. The thickness of the layer was measured using the CMI gauge as in Example 1, by taking a series of 10 to 20 measurements on different spots on the surface of the steel to obtain an average coating thickness. The thickness was found to be about 15 microns.

TABLE 6

Deposition Rate of Zinc Films

| # | Components | Concentration g/L | Deposition time minutes | Thickness microns | Deposition rate microns/hr | Substrate |
|---|---|---|---|---|---|---|
| 1 | SnCl$_2$ | 60 | 900 | 15 | 1 | Steel |
|   | Zn[1] | 100 | | | | |
|   | Methanol[2] | to 1 L | | | | |
|   | | | 900 | 15 | 1 | Aluminum[3] |
|   | | | 900 | 15 | 1 | Titanium |

Notes:
[1] Nanopowder with average particle size of 100 nm was used;
[2] The bath was aged for 20 hours until sufficient methanol evaporated to produce a paste;
[3] Substrate had been polished with abrasive paper and then was immediately immersed into the bath.

Example 22

In a dry argon environment, a solution was prepared of 120 grams of titanium trichloride diluted to 1 liter of methanol (Table 3). Two different samples of aluminum substrate, one pure aluminum and the second aluminum 6061 were used. The pure aluminum was immersed and agitated in the mixture for five minutes. A black coating formed on the surface of the aluminum that was measured to be about 0.5 microns by weighing before and after deposition. The second aluminum sample (6061) was immersed in the mixture for 15 hours with occasional agitation. Again, a black coating formed on the aluminum that was measured to be about 5 microns thick. In both cases the sample was bent over a mandrel. The coating fractured at the sharpest portion of the radius but did not flake off the substrate.

TABLE 7

Deposition Rate of Titanium Films

| # | Components | Concentration g/L | Deposition time minutes | Thickness microns | Deposition rate microns/hr | Substrate |
|---|---|---|---|---|---|---|
| 1a | TiCl$_3$ | 120 | 5 | 0.5 | 6 | Aluminum[1,2] |
| 1b | Methanol | to 1 L | 900 | 5 | 0.3 | Aluminum Alloy[2,3] |

Notes:
[1] Purity is 99.997% according to Alfa Aesar;
[2] Substrate had been polished with abrasive paper and then was immediately immersed into the bath;
[3] Aluminum alloy 6061.

Example 23

In a dry argon environment, a mixture was prepared of 120 grams of TaCl$_3$ in 1 liter of methanol. An aluminum alloy 6061 sample was immersed in the mixture for 8 minutes and a coating of about 0.5 microns found thick.

TABLE 8

Deposition Rate of Tantalum Films

| # | Components | Concentration | Deposition time minutes | Thickness microns | Deposition rate micron/hr | Substrate |
|---|---|---|---|---|---|---|
| 1 | TaCl$_3$ Methanol | 120 | 8 | 0.5 | 4 | Aluminum[1,2] |

Notes:
[1]Substrate had been polished with abrasive paper and then was immediately immersed into the bath;
[2]Aluminum alloy 6061.

Example 24

Two grams of gold powder was dissolved in minumum volume of aqua regia. Aqua regia was prepared by mixing of 3 volumes concentrated HCl and one volume concentrated HNO$_3$. Solution was evaporated to dryness. The residue was dissolved in 1 liter of Methanol. Samples of steel, stainless steel, tungsten, tantalum, molybdenum, niobium, silver, titanium, zinc and aluminum were polished with abrasive paper and were put into the bath. The thickness of the layer was measured by weighing before and after deposition. Results are reported in Table 9.

TABLE 9

Deposition Rate of Gold Films

| # | Components | Concentration g/L | Deposition time minutes | Thickness microns | Deposition rate micron/hr | Substrate |
|---|---|---|---|---|---|---|
| 1a | Gold in aqua regia Methanol | 2 g (gold basis) to 1 L | 20 | 0.3 | 1 | Steel[1] |
| 1b | | | 20 | 0.3 | 1 | Stainless Steel[1] |
| 1c | | | 60 | 0.3 | 0.3 | Tungsten[2] |
| 1d | | | 60 | 0.3 | 0.3 | Tantalum[2] |
| 1e | | | 20 | 0.3 | 1 | Molybdenum[2] |
| 1f | | | 20 | 0.3 | 1 | Niobium[2] |
| 1g | | | 10 | 0.3 | 1 | Silver |
| 1h | | | 20 | 0.3 | 1 | Titanium[2] |
| 1i | | | 20 | 0.3 | 1 | Nickel[2] |
| 1j | | | 10 | 0.3 | 2 | Zinc[2] |
| 1l | | | 20 | 0.3 | 2 | Aluminum[2] |

Notes:
[1]Substrate had been polished with abrasive paper;
[2]Substrate had been polished with abrasive paper and then was immediately immersed into the bath.

What is claimed is:

1. A method of electroless deposition of metals onto metallic or catalyzed non-conductive substrates comprising the steps of (a) preparing a non-aqueous mixture comprising a non-aqueous organic liquid and a dispersed inorganic metal salt, wherein said liquid is selected from the group consisting of an alcohol, diol and polyol, and has at least one hydroxyl group; and (b) disposing said substrate into said mixture to deposit a metallic film thereon.

2. A method as set forth in claim 1 wherein the dispersed metal salt is a chloride dissolved in the non-aqueous organic liquid.

3. A method as set forth in claim 1 wherein step (a) includes adding a metal nanopowder to form a paste wherein said metal nanopowder is selected from the group consisting of copper, cobalt, nickel, tin and gold dispersed in the non-aqueous liquid.

4. A method as set forth in claim 1 including a solvating agent and wherein said nonaqueous liquid is selected from the group consisting of ethanol, ethylene glycol and methanol.

5. A method as set forth in claim 1 wherein said dispersed metal salt is selected from the group consisting of copper chloride and gold chloride.

6. A method as set forth in claim 3 wherein said mixture further comprises a solvating agent to promote the solubility of the metal nanopowder.

7. A method of electroless deposition of metals onto metallic or catalyzed non-conductive substrates comprising the steps of (a) preparing a non-aqueous mixture comprising a non-aqueous organic liquid, a metal salt dispersed therein and a thickener, and (b) applying said mixture as a paint over said substrate.

8. A method as set forth in claim 7 wherein said metal salt is comprised of copper, nickel or cobalt cations.

9. A method as set forth in claim 7 wherein said mixture is applied over said substrate using a brush, roller, or spray.

10. A method as set forth in claim 7 wherein said non-aqueous liquid is selected from the group consisting of alcohols, diols and polyols.

11. A method as set forth in claim 1 or 7 wherein said mixture of step (a) further comprises an additional reducing agent.

12. A method as set forth in claim 11 wherein said reducing agent is stannous chloride or formaldehyde.

* * * * *